(12) United States Patent
Sharf (10) Patent No.: US 12,225,692 B2
(45) Date of Patent: Feb. 11, 2025

(54) HEAT EXCHANGE ASSEMBLY FOR AN ELECTRICAL DEVICE

(71) Applicant: TE Connectivity Services GmbH, Schaffhausen (CH)

(72) Inventor: Alex Michael Sharf, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 17/191,926

(22) Filed: Mar. 4, 2021

(65) Prior Publication Data

US 2022/0287206 A1    Sep. 8, 2022

(51) Int. Cl.
*H05K 7/20* (2006.01)

(52) U.S. Cl.
CPC ..... *H05K 7/20781* (2013.01); *H05K 7/20772* (2013.01); *H05K 7/20254* (2013.01); *H05K 7/20336* (2013.01)

(58) Field of Classification Search
CPC . H05K 7/20627–20654; H05K 7/20763–2079
See application file for complete search history.

(56) References Cited

U.S. PATENT DOCUMENTS

| | | | |
|---|---|---|---|
| 6,776,221 B2 * | 8/2004 | Montgomery | F28D 15/046 174/16.3 |
| 6,796,372 B2 * | 9/2004 | Bear | F28F 13/00 165/185 |
| 7,012,807 B2 * | 3/2006 | Chu | G06F 1/20 165/80.4 |
| 7,403,384 B2 * | 7/2008 | Pflueger | H05K 7/20545 361/679.48 |
| 7,626,820 B1 * | 12/2009 | Konshak | H05K 7/20672 165/80.4 |
| 8,031,464 B2 * | 10/2011 | Adkins | G06F 1/182 361/679.52 |
| 9,343,851 B2 | 5/2016 | Bucher et al. | |
| 9,620,890 B1 | 4/2017 | Vino, IV et al. | |
| 9,668,379 B1 | 5/2017 | Bucher | |
| 9,668,380 B2 | 5/2017 | Bucher | |
| 9,841,772 B2 | 12/2017 | Bucher | |
| 9,912,107 B2 | 3/2018 | Bucher | |
| 10,993,352 B2 | 4/2021 | Bucher | |
| 11,147,192 B2 * | 10/2021 | Gao | G06F 1/183 |
| 11,240,934 B1 | 2/2022 | Bucher | |
| 11,291,140 B2 | 3/2022 | Bucher | |
| 11,439,042 B2 | 9/2022 | Bucher | |
| 11,486,661 B2 | 11/2022 | Graham | |
| 11,778,786 B2 | 10/2023 | Bucher | |

(Continued)

*Primary Examiner* — Zachary Pape (57) ABSTRACT

A heat exchange assembly includes a component heat exchanger that has a component thermal interface configured to thermally interface with an electrical component of an electrical device. The heat exchange assembly includes a device heat exchanger having a separable thermal interface configured to extend to an exterior of a device housing of the electrical device to interface with an external heat exchanger. The device heat exchanger is configured to transfer heat to the external heat exchanger across the separable thermal interface. The heat exchange assembly includes a thermal conduit between the component heat exchanger and the device heat exchanger.

12 Claims, 8 Drawing Sheets

(56) References Cited

U.S. PATENT DOCUMENTS

| | | | |
|---|---|---|---|
| 2006/0187639 A1* | 8/2006 | Carswell | H05K 7/2079 |
| | | | 165/80.4 |
| 2007/0146997 A1* | 6/2007 | Foster | H05K 7/1487 |
| | | | 361/700 |
| 2007/0291452 A1* | 12/2007 | Gilliland | H05K 7/20781 |
| | | | 361/699 |
| 2008/0043442 A1* | 2/2008 | Strickland | H05K 7/20781 |
| | | | 361/709 |
| 2015/0208551 A1* | 7/2015 | Davidson | H05K 7/20781 |
| | | | 165/80.2 |
| 2017/0202114 A1* | 7/2017 | Davidson | H05K 7/20809 |
| 2020/0373706 A1 | 11/2020 | Bucher et al. | |
| 2023/0378686 A1 | 11/2023 | Bucher et al. | |
| 2023/0396023 A1 | 12/2023 | Bucher et al. | |

* cited by examiner

HEAT EXCHANGE ASSEMBLY FOR AN ELECTRICAL DEVICE

BACKGROUND OF THE INVENTION

The subject matter herein relates generally to heat exchange assemblies for an electrical device.

Electrical devices are used in various applications, such as computer systems, data communication systems, and the like. For example, the electrical device may be a server rack, a network switch, an I/O module, and the like. Electrical components of the electrical device generate heat during operation. Some known electrical devices include cooling modules for cooling the electrical components. For example, a heat sink or a cold plate may be provided for cooling the electrical component. Some known electrical devices include fans for cooling the heat sink or cold plate. Air cooling using fans may be insufficient in some electrical devices. Other known electrical devices include a liquid cooling circuit for cooling the heat sink or the cold plate. The liquid cooling circuit includes liquid ports for interfacing with a liquid supply system. The liquid cooling components and the components of the liquid supply system increase the cost of the electrical devices. Additionally, the interface may be a source for coolant leakage.

A need remains for a heat exchange assembly for electrical components that may provide cooling for electrical components in a cost effective and reliable manner.

BRIEF DESCRIPTION OF THE INVENTION

In one embodiment, a heat exchange assembly is provided. The heat exchange assembly includes a component heat exchanger that has a component thermal interface configured to thermally interface with an electrical component of an electrical device. The heat exchange assembly includes a device heat exchanger having a separable thermal interface configured to extend to an exterior of a device housing of the electrical device to interface with an external heat exchanger. The device heat exchanger is configured to transfer heat to the external heat exchanger across the separable thermal interface. The heat exchange assembly includes a thermal conduit between the component heat exchanger and the device heat exchanger.

In another embodiment, an electrical device is provided. The electrical device includes a device housing that has a frame that defining a cavity. An electrical component is received in the cavity. A heat exchange assembly is received in the cavity. The heat exchange assembly includes a component heat exchanger that has a component thermal interface thermally coupled to the electrical component. The heat exchange assembly includes a device heat exchanger that has a separable thermal interface extending to an exterior of the frame of the device housing to interface with an external heat exchanger. The device heat exchanger transfers heat to the external heat exchanger across the separable thermal interface. The heat exchange assembly includes a thermal conduit between the component heat exchanger and the device heat exchanger.

In a further embodiment, an electrical device is provided. The electrical device includes a device housing that has a frame defining a cavity. An electrical component is received in the cavity. A heat exchange assembly is received in the cavity. The heat exchange assembly includes a component heat exchanger that has a component thermal interface thermally coupled to the electrical component. The heat exchange assembly includes a device heat exchanger that has a separable thermal interface extending to an exterior of the frame of the device housing to interface with an external heat exchanger. The device heat exchanger transfers heat to the external heat exchanger across the separable thermal interface. The heat exchange assembly includes a thermal conduit between the component heat exchanger and the device heat exchanger. The thermal conduit includes a liquid pipe circulating liquid between the component heat exchanger and the device heat exchanger. The liquid pipe is spaced apart from the separable thermal interface such that the separable thermal interface is a dry interface with the external heat exchanger.

DETAILED DESCRIPTION OF THE INVENTION

Figure 1:
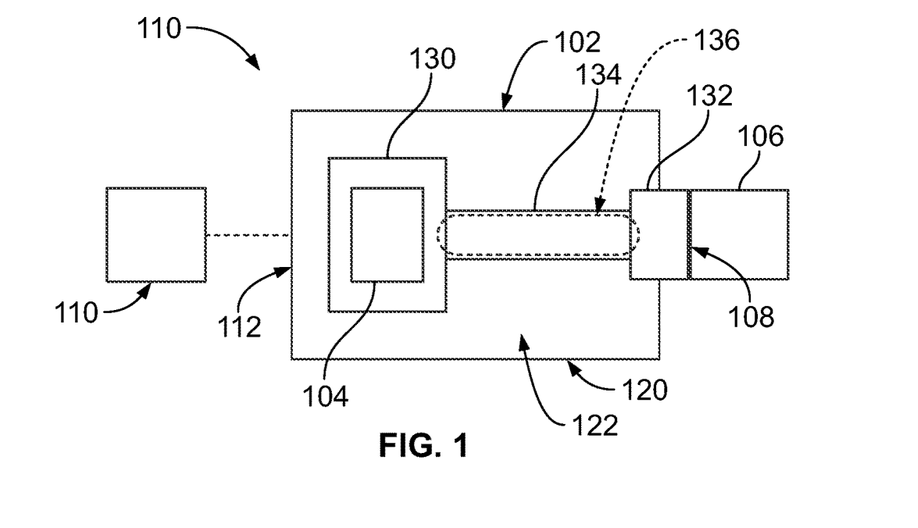
FIG. 1 is a schematic view of a heat exchange assembly in accordance with an exemplary embodiment for an electrical device.

FIG. 1 is a schematic view of a heat exchange assembly 100 in accordance with an exemplary embodiment for an electrical device 102. The electrical device 102 includes one or more electrical components 104. The heat exchange assembly 100 is used for cooling the electrical components 104. In an exemplary embodiment, the heat exchange assembly 100 interfaces with one or more external heat exchangers 106 to transfer heat away from the electrical device 102 through an external heat exchange system. The heat exchange assembly 100 is contained within the electrical device 102 and interfaces with the external heat exchanger 106 at a separable thermal interface 108. In an exemplary embodiment, the separable thermal interface 108 is a dry interface. A "dry interface" is an interface wherein coolant or cooling liquid is not transferred across the separable thermal interface 108. In other words, when coolant or cooling liquid is used in either the external heat exchanger 106 or the heat exchange assembly 100, such coolant or cooling liquid is self-contained within a closed liquid loop of the external heat exchanger 106 or the heat exchange assembly 100 and is not transmitted across the dry interface. The dry interface may have thermal grease or lubricant at the interface, but again, does not transfer liquid or coolant across the interface.

In various embodiments, the electrical device 102 is a pluggable device configured to be loaded into and removed from a system component. For example, the electrical device 102 may include a mating interface for mating with the system component, such as to create an electrical connection with the system component. The heat exchange assembly 100 may be mated to and unmated from the external heat exchanger 106, which is part of the system component, at the separable thermal interface 108. In various embodiments, the electrical device 102 is a network switch, a server blade, a router, a patch panel or another type of communication component that may be received in an equipment rack. In other various embodiments, the electrical device 102 is a pluggable module, such as a pluggable drive, a memory module, a hard drive, an I/O module, and the like. In other various embodiments, the electrical device 102 is a power supply.

In an exemplary embodiment, an electrical connector 110 is configured to be mated with the electrical device 102. For example, the electrical device 102 includes a mating interface 112 for mating with the electrical connector 110. The electrical connector 110 is configured to be electrically connected to the electrical component 104, such as through a direct electrical connection or an indirect electrical connection. For example, the electrical component 104 may be mounted to a circuit board and the electrical connector 110 may be mated to a mating electrical connector mounted to the circuit board.

In an exemplary embodiment, the electrical device 102 includes a device housing 120 forming a cavity 122 that receives the electrical component 104. The heat exchange assembly 100 is provided within the cavity 122. The heat exchange assembly 100 is configured to be mated with the external heat exchanger 106 exterior of the device housing 120. The heat exchange assembly 100 provides cooling to the components of the electrical device 102, such as the electrical component 104 and interfaces with the external heat exchanger 106 to dump excess heat from the heat exchange assembly 100 into the external heat exchanger 106.

In an exemplary embodiment, the heat exchange assembly 100 includes a component heat exchanger 130 that is thermally coupled to the electrical component 104 and a device heat exchanger 132 that defines the separable thermal interface 108 and is configured to thermally couple to the external heat exchanger 106. In an exemplary embodiment, the heat exchange assembly 100 includes a thermal conduit 134 between the component heat exchanger 130 and the device heat exchanger 132. The thermal conduit 134 circulates heat through the system to dissipate heat from the components. In various embodiments, the thermal conduit 134 includes a closed liquid loop 136 for transferring heat between the component heat exchanger 130 and the device heat exchanger 132. The liquid is used to circulate the heat. For example, the liquid may be circulated through the liquid loop. However, the heat may be circulate by other means other than circulating liquid. For example, the heat may be transferred by the liquid changing state or by convection. The heat is transferred by the thermal conduit to reduce the operating temperature of the various components. The component heat exchanger 130 may be a cold plate, a heatsink, or another type of heat exchanger. The device heat exchanger 132 may be a cold plate, a heatsink, or another type of heat exchanger. The device heat exchanger 132 is separate and discrete from the component heat exchanger 130 in various embodiments. The device heat exchanger 132 may be located remote from the component heat exchanger 130.

In various embodiments, the thermal conduit 134 includes liquid pipes extending between the component heat exchanger 130 and the device heat exchanger 132. For example, the thermal conduit 134 may include heat pipes, a thermosiphon, or other types of pipes for transferring coolant through the closed loop 136. The liquid pipes may extend into the component heat exchanger 130 and/or the device heat exchanger 132. The liquid coolant may be actively circulated through the thermal conduit 134, such as by a pump. Alternatively, the liquid coolant may be passively circulated through the thermal conduit 134, such as by convection or may not be circulated at all, rather relying upon the static liquid to passively transfer the heat from the system. In other various embodiments, the thermal conduit 134 includes a thermal bridge extending between the component heat exchanger 130 and the device heat exchanger 132. For example, the thermal conduit 134 may include a heat spreader or other type of heat exchanger. The thermal bridge may include passages or channels allowing liquid flow through the thermal conduit 134. The passages form the closed liquid loop 136. In various embodiments, the thermal conduit 134 may include a vapor chamber. In other various embodiments, rather than having a liquid coolant loop, the heat exchange assembly 100 may provide cooling without liquid coolant.

In an exemplary embodiment, the electrical device 102 may additionally cool the heat exchange assembly 100 using air cooling of the various components. For example, fans may be provided within the device housing 120 to circulate air around the component heat exchanger 130 and/or the device heat exchanger 132 and/or the thermal conduit 134.

Figure 2:
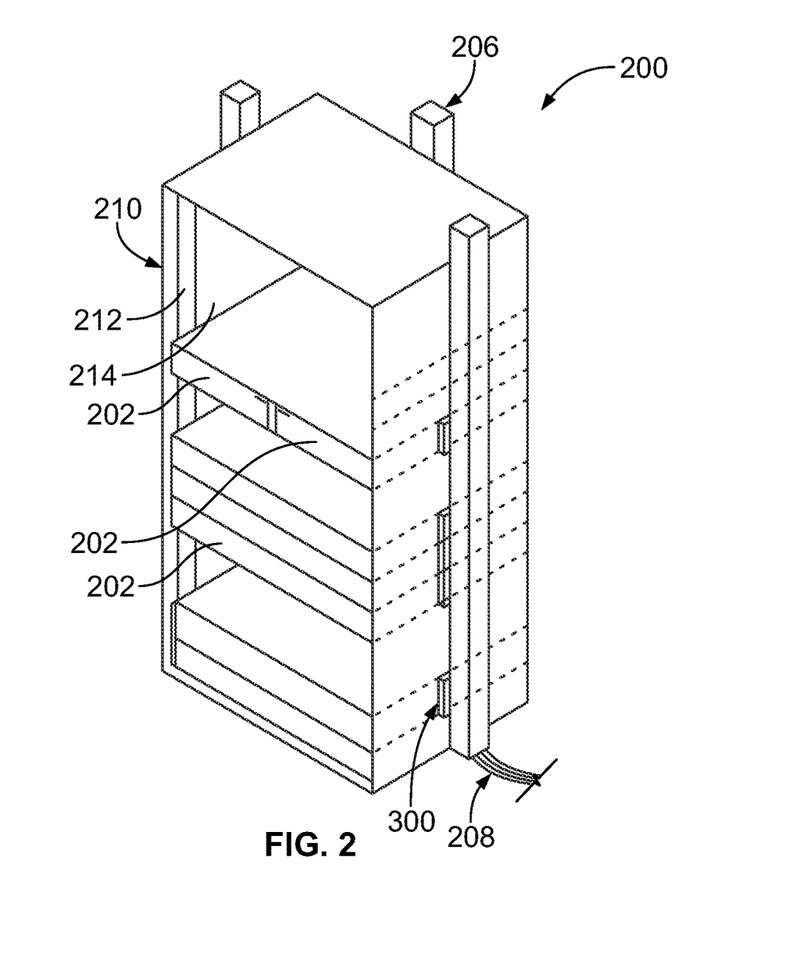
FIG. 2 is a perspective view of a system component in accordance with an exemplary embodiment including electrical devices having corresponding heat exchange assemblies.

FIG. 2 is a perspective view of a system component 200 in accordance with an exemplary embodiment including one or more electrical devices 202 having corresponding heat exchange assemblies 300 used for cooling the electrical devices 202. The system component 200 includes one or more external heat exchangers 206 configured to interface with the heat exchange assemblies 300 of the electrical devices 202 for dissipating heat from the heat exchange assemblies 300. In an exemplary embodiment, the external heat exchanger 206 includes a liquid cooling system 208 for circulating liquid coolant through the external heat exchanger 206 for quickly and efficiently dissipating heat from the heat exchange assemblies 300. The liquid coolant of the liquid cooling system 208 is a closed system separate from the electrical devices 202. The liquid coolant of the liquid cooling system 208 does not flow into the electrical devices 202. In contrast, the interfaces between the external heat exchanger 206 and the heat exchange assemblies 300 of the electrical devices 202 are dry interfaces.

In an exemplary embodiment, the system component 200 is a network component having an equipment rack 210 for the electrical devices 202. The equipment rack 210 includes a frame 212 for supporting a plurality of the electrical devices 202. Optionally, the equipment rack 210 may include a cabinet 214 surrounding the frame 212 and the electrical devices 202. The external heat exchanger 206 is mounted to the frame 212 and/or the cabinet 214. In various embodiments, the electrical devices 202 may be vertically stacked in the equipment rack 210 either directly on top of each other or with spaces between. In other various embodiments, the electrical devices 202 may be horizontally stacked in the equipment rack 210. In various embodiments, the electrical devices 202 may engage each other within the equipment rack 210. The heat exchange assemblies 300 may be thermally coupled to each other to dissipate heat between the electrical devices 202 in various embodiments.

Figure 3:
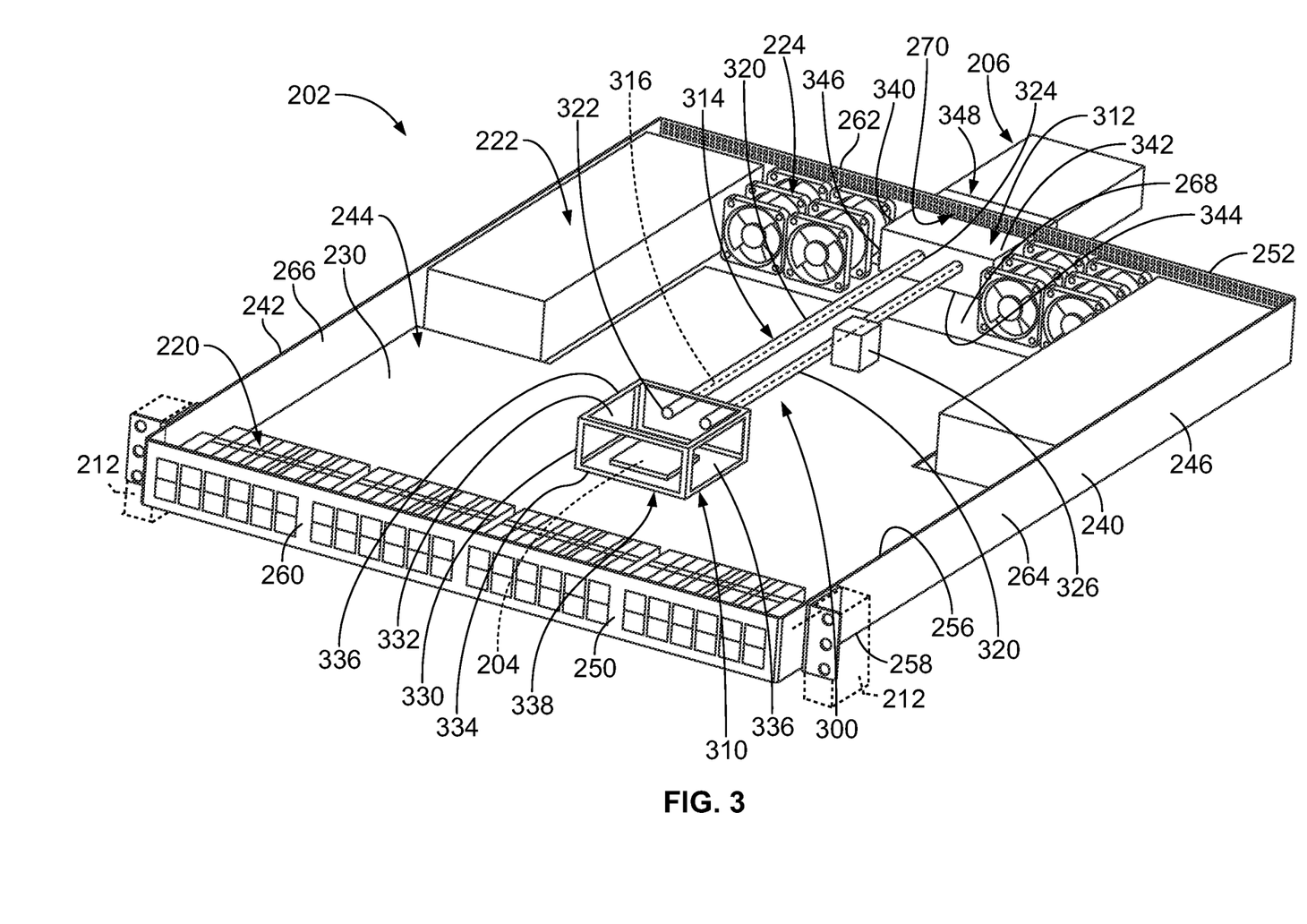
FIG. 3 is a top perspective view of the electrical device showing the heat exchange assembly in accordance with an exemplary embodiment.

FIG. 3 is a top perspective view of the electrical device 202 in accordance with an exemplary embodiment showing the heat exchange assembly 300 in accordance with an exemplary embodiment. In the illustrated embodiment, the electrical device 202 is a network switch. However, other types of electrical devices may be used in alternative embodiments. The heat exchange assembly 300 is used for cooling an electrical component 204 of the electrical device 202. The heat exchange assembly 300 may be used for cooling multiple electrical components 204 in various embodiments. The heat exchange assembly 300 may be used for cooling different types of electrical components in various embodiments.

In an exemplary embodiment, the electrical device 202 includes different types of electrical components 204. In the illustrated embodiment, the electrical component 204 is a processor or chip, such as an ASIC. However, other types of electrical components may be provided in alternative embodiments, such as a CPU. The electrical device 202 includes other types of electrical components, such as I/O modules 220, power supplies 222, fans 224, and the like. In an exemplary embodiment, the electrical device 202 includes a circuit board 230. The electrical components 204 may be electrically and/or physically connected to the circuit board 230. For example, the electrical components 204 may be directly mounted to the circuit board 230.

In an exemplary embodiment, the electrical device 202 includes a device housing 240 having a frame 242 forming a cavity 244. The frame 242 includes a plurality of walls 246 form in the cavity 244. The electrical components 204 are located within the cavity 244. In various embodiments, the electrical components 204 may be entirely contained within the cavity 244. The circuit board 230 is located within the cavity 244. In an exemplary embodiment, the heat exchange assembly 300 is located within the cavity 244. The heat exchange assembly 300 provides cooling for the electrical components 204 within the cavity 244. The heat exchange assembly 300 interfaces with the external heat exchanger 206 exterior of the device housing 240.

The electrical device 202 extends between a front 250 and a rear 252. The electrical device 202 includes a top 256 and a bottom 258. In an exemplary embodiment, the frame 242 of the device housing 240 includes a front wall 260 at the front 250 and a rear wall 262 at the rear 252. The frame 242 includes side walls 264, 266 extending between the front wall 260 and the rear wall 262. The frame 242 includes a bottom wall 268 at the bottom 258. In various embodiments, the top 256 is open. However, the top 256 may be closed in alternative embodiments.

In an exemplary embodiment, the heat exchange assembly 300 includes a component heat exchanger 310 that is thermally coupled to the electrical component 204 and a device heat exchanger 312 that defines a separable thermal interface and is configured to thermally couple to the external heat exchanger 206. In an exemplary embodiment, the heat exchange assembly 300 includes a thermal conduit 314 between the component heat exchanger 310 and the device heat exchanger 312. In various embodiments, the thermal conduit 314 includes a closed liquid loop 316 for transferring heat between the component heat exchanger 310 and the device heat exchanger 312. The component heat exchanger 310 may be a cold plate, a heatsink, or another type of heat exchanger. The device heat exchanger 312 may be a cold plate, a heatsink, or another type of heat exchanger. The device heat exchanger 312 is separate and discrete from the component heat exchanger 310 in various embodiments. The device heat exchanger 312 may be located remote from the component heat exchanger 310.

In various embodiments, the thermal conduit 314 includes liquid pipes 320 extending between the component heat exchanger 310 and the device heat exchanger 312. For example, the thermal conduit 314 may include heat pipes, a thermosiphon, or other types of pipes for transferring coolant through the closed liquid loop 316. The liquid pipes 320 may be hollow, metal pipes. The liquid pipes 320 may be flexible pipes, such as flexible, plastic pipes. The liquid pipes 320 may be defined by passages formed in a solid metal block in various embodiments. In various embodiments, two liquid pipes 320 are provided, such as a supply liquid pipe and a return liquid pipe. However, the thermal conduit 314 may include additional liquid pipes in alternative embodiments. The liquid pipes 320 extend between a first end 322 and a second end 324. The first end 322 may extend into the component heat exchanger 310. The component heat exchanger 310 may include a liquid passage that receives the liquid from the liquid pipes 320. In other various embodiments, the component heat exchanger 310 may include separate liquid pipes that are coupled to the liquid pipes 320. In other various embodiments, the liquid pipes 320 may form the liquid path through the component heat exchanger 310 rather than having separate liquid pipes associated with the component heat exchanger 310. The second end 324 may extend into the device heat exchanger 312. The device heat exchanger 312 may include a liquid passage that receives the liquid from the liquid pipes 320. In other various embodiments, the device heat exchanger 312 may include separate liquid pipes that are coupled to the liquid pipes 320. In other various embodiments, the liquid pipes 320 may form the liquid path through the device heat exchanger 312 rather than having separate liquid pipes associated with the component heat exchanger 310. In an exemplary embodiment, a pump 326 is provided for circulating liquid coolant through the thermal conduit 314. Alternatively, the liquid coolant may be passively circulated through the thermal conduit 314, such as by convection. The thermal conduit 314 is used to circulate or transfer heat from the components.

The component heat exchanger 310 includes a heat exchange body 330 configured to be thermally coupled to the electrical component 204. The heat exchange body 330 may be a solid metal block in various embodiments. The heat exchange body 330 may include passages therethrough, such as for airflow or liquid flow through the heat exchange body 330, such as to enhance cooling of the electrical component 204. The heat exchange body 330 may include fins posts or other structures for dissipating heat from the heat exchange body 330. For example, the fans 224 may circulate airflow across the heat dissipating structures to enhance cooling.

The component heat exchanger 310 includes a top 332 and a bottom 334. The component heat exchanger 310 includes sides 336 between the top 332 and the bottom 334. For example, the component heat exchanger 310 may have four sides forming a rectangular shaped component heat exchanger 310. However, the component heat exchanger 310 may have other shapes in alternative embodiments including greater or fewer sides 336. The bottom 334 faces the electrical component 204 and defines a component thermal interface 338 configured to thermally interfaces with the electrical component 204. The component thermal interface 338 may be flat or planar to interface with the electrical component 204. However, the component thermal interface 338 may have pockets or other surfaces for interfacing with the electrical component 204 in alternative embodiments. The top 332 may be planar in various embodiments and parallel to the bottom 334. However, the top 332 may be non-planar in alternative embodiments, such as including the fins or posts or other heat dissipating structures. In an exemplary embodiment, the thermal conduit 314 interfaces with the component heat exchanger 310 at one of the sides 336 for direct thermal transfer between the component heat exchanger 310 and the thermal conduit 314. However, the thermal conduit 314 may interface with other surfaces, such as the top 332 in alternative embodiments.

The device heat exchanger 312 includes a heat exchange body 340 configured to be thermally coupled to the external heat exchanger 206, such as a to dry, separable interface. The heat exchange body 340 may be a solid metal block in various embodiments. The heat exchange body 340 may include passages therethrough, such as for airflow or liquid flow through the heat exchange body 340, such as to enhance cooling of the electrical component 204. The heat exchange body 340 may include fins posts or other structures for dissipating heat from the heat exchange body 340. For example, the fans 224 may circulate airflow across the heat dissipating structures to enhance cooling.

The device heat exchanger 312 includes a top 342 and a bottom 344. The device heat exchanger 312 includes sides 346 between the top 342 and the bottom 344. For example, the device heat exchanger 312 may have four sides forming a rectangular shaped device heat exchanger 312. However, the device heat exchanger 312 may have other shapes in alternative embodiments including greater or fewer sides 346. In an exemplary embodiment, the device heat exchanger 312 is aligned with an opening 270 in one of the walls 246 of the device housing 240, such as the rear wall 262. The device heat exchanger 312 may extend into and may extend through the opening 270 in the wall 246 in various embodiments to interface with the external heat exchanger 206. The side 346 facing the external heat exchanger 206 defines a separable thermal interface 348 of the device heat exchanger 312. For example, in the illustrated embodiment, the separable thermal interface 348 is at a rear side of the device heat exchanger 312. The separable thermal interface extends to the exterior of the device housing 240 to interface with the external heat exchanger 206. The separable thermal interface 348 may be flat or planar to interface with the electrical component 204. However, the separable thermal interface 348 may have features for interfacing with the external heat exchanger 206, such as shoulders, ledges, tabs, plates, grooves, and the like in alternative embodiments. In an exemplary embodiment, the thermal conduit 314 interfaces with the device heat exchanger 312 at one of the sides 346, such as a front side, for direct thermal transfer between the device heat exchanger 312 and the thermal conduit 314. However, the thermal conduit 314 may interface with other surfaces, such as the top 342, the bottom 344 or another side 346 in alternative embodiments.

In operation, the component heat exchanger 310 draws heat away from the electrical component 204, the thermal conduit 314 draws heat away from the component heat exchanger 310, the device heat exchanger 312 draws heat away from the thermal conduit 314, and the external heat exchanger 206 draws heat away from the device heat exchanger 312. The thermal conduit 314 uses the liquid loop 316 to enhance thermal transfer from the component heat exchanger 310 to the device heat exchanger 312. However, the liquid loop 316 is a closed loop to reduce risk of liquid leakage at the interface between the electrical device 202 and the system. The separable thermal interface 348 is a dry interface. The liquid in the liquid loop 316 does not span across the separable thermal interface 348. Rather, the two liquid cooling systems (the device cooling system and the system cooling system) are separate, closed circuits. The liquid loop 316 is spaced apart from and separate from the separable thermal interface 348.

In the illustrated embodiment, the device heat exchanger 312 is located at the rear wall 262 of the electrical device 202 for interfacing with the external heat exchanger 206 rearward of the electrical device 202. However, the device heat exchanger 312 may additionally or alternatively be located at other locations, such as at the side walls 264 and/or 266, at the front wall 260, at the bottom wall 268, at the top 256, or elsewhere. For example, multiple device heat exchangers 312 may be provided and routed to different areas of the electrical device 202. Each device heat exchanger 312 may have a corresponding thermal conduit 314 associated therewith. In other various embodiments, multiple component heat exchangers 310 may be provided, such as for interfacing with and dissipating heat from, different electrical components 204.

Figure 4:
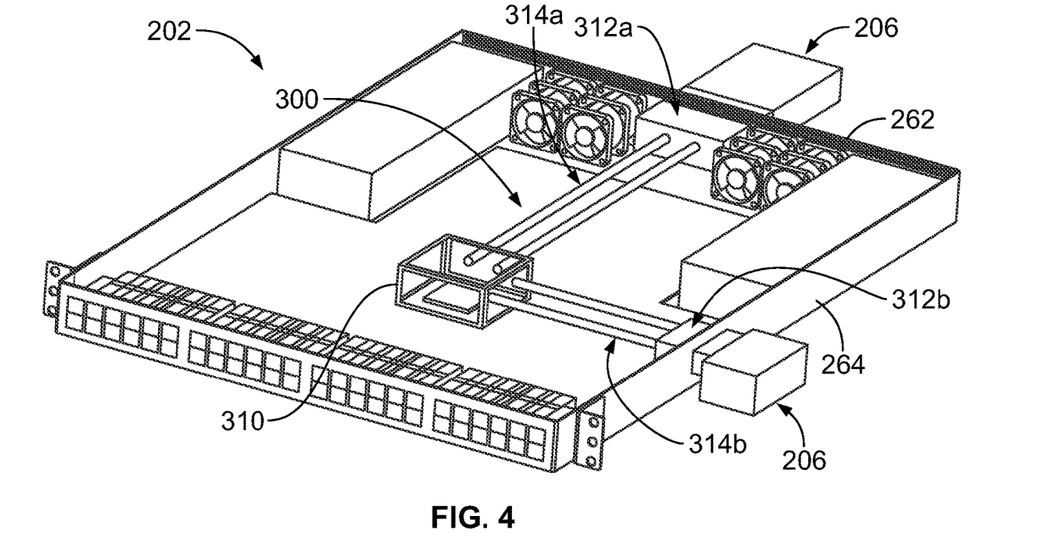
FIG. 4 is a top perspective view of the electrical device showing the heat exchange assembly in accordance with an exemplary embodiment.

FIG. 4 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, a first device heat exchanger 312*a* and a second device heat exchanger 312*b*. A first thermal conduit 314*a* extends between the component heat exchanger 310 and the first device heat exchanger 312*a*. A second thermal conduit 314*b* extends between the component heat exchanger 310 and the second device heat exchanger 312*b*. The first device heat exchanger 312*a* is provided at the rear wall 262 for interfacing with the external heat exchanger 206 at the rear and the second device heat exchanger 312*b* is provided at the side wall 264 for interfacing with the external heat exchanger 206.

Figure 5:
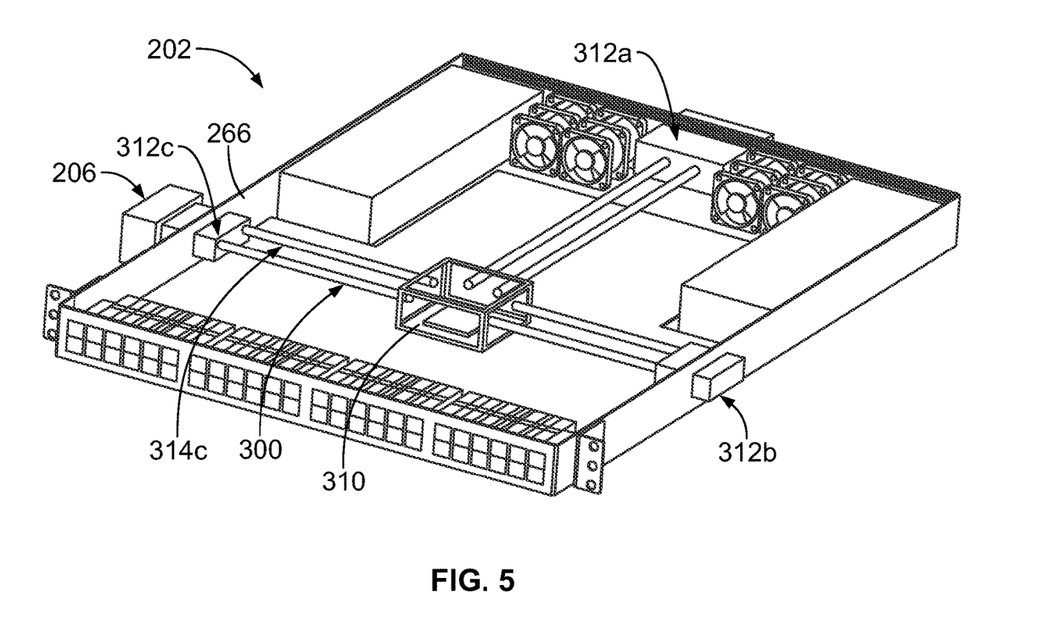
FIG. 5 is a top perspective view of the electrical device showing the heat exchange assembly in accordance with an exemplary embodiment.

FIG. 5 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, the first device heat exchanger 312*a*, the second device heat exchanger 312*b*, and a third device heat exchanger 312*c*. A third thermal conduit 314*c* extends between the component heat exchanger 310 and the third device heat exchanger 312c. The third device heat exchanger 312c is provided at the side wall 266 for interfacing with the external heat exchanger 206.

Figure 6:
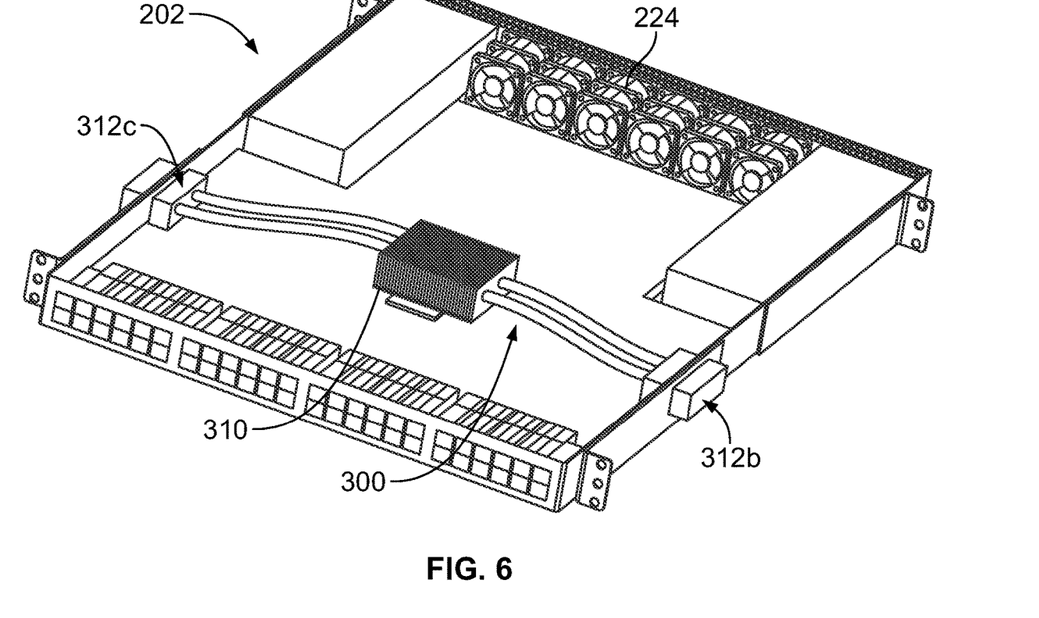
FIG. 6 is a top perspective view of the electrical device showing the heat exchange assembly in accordance with an exemplary embodiment.

FIG. 6 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, and the first and second side device heat exchangers 312b, 312c. The electrical device 202 does not include the rear device heat exchanger 312a, but rather includes additional fans 224 for air cooling.

Figure 7:
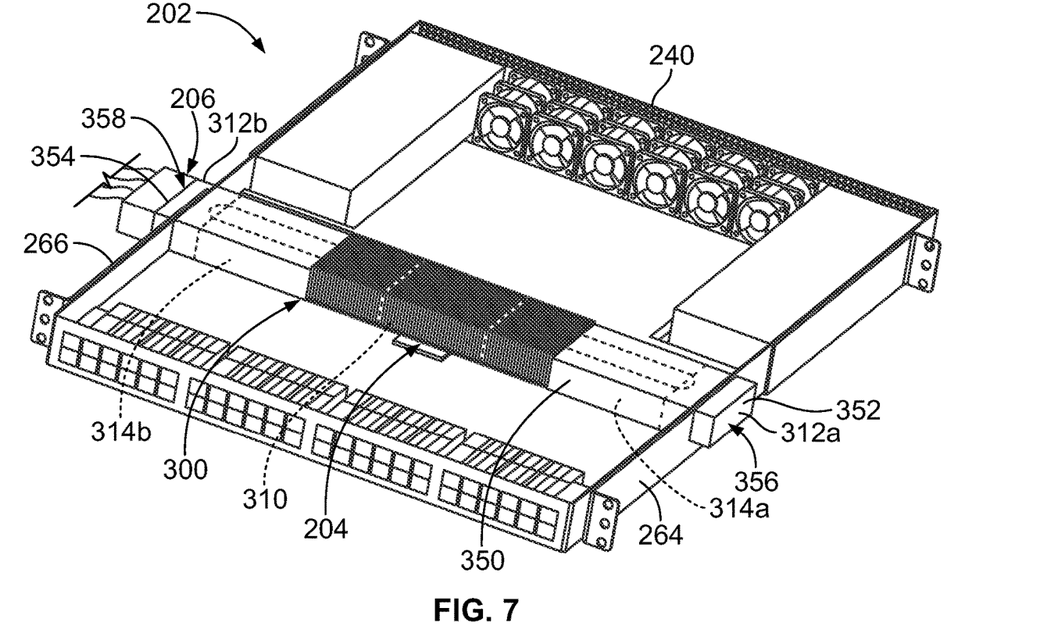
FIG. 7 is a top perspective view of the electrical device showing the heat exchange assembly in accordance with an exemplary embodiment.

FIG. 7 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, and device heat exchangers 312a, 312b at first and second sides of the component heat exchanger 310. Thermal conduits 314a, 314b extend between the component heat exchanger 310 and the device heat exchangers 312a 312b. The device heat exchangers 312a, 312b extend to the side walls 264, 266 for interfacing with the external heat exchangers 206. In an exemplary embodiment, the component heat exchanger 310, the device heat exchangers 312a, 312b, and the thermal conduits 314a, 314b are integral with each other, such as part of a single, monolithic structure. For example, the structure may be a cold plate, a heat sink, or another type of heat dissipating structure. The structure includes a heat exchange body 350 forming the component heat exchanger 310, the device heat exchangers 312a, 312b, and the thermal conduits 314a, 314b. The heat exchange body 350 extends between a first end 352 and a second end 354. The heat exchange body 350 includes a first separable thermal interface 356 at the first end 352 and a second separable thermal interface 358 at the second end 354. The separable thermal interfaces 356, 358 interface with the external heat exchangers 206 to transfer heat to the external heat exchangers 206. The heat exchange body extends from the electrical component 204 to the exterior of the device housing 240 to interface with the external heat exchangers 206. The liquid loop of the heat exchange assembly 300 may be closed and entirely contained within the heat exchange body 350, but extend generally from the first end 352 to the second end 354. The liquid loop may extend along a tortuous, serpentine path through the heat exchange body 350.

Figure 8:
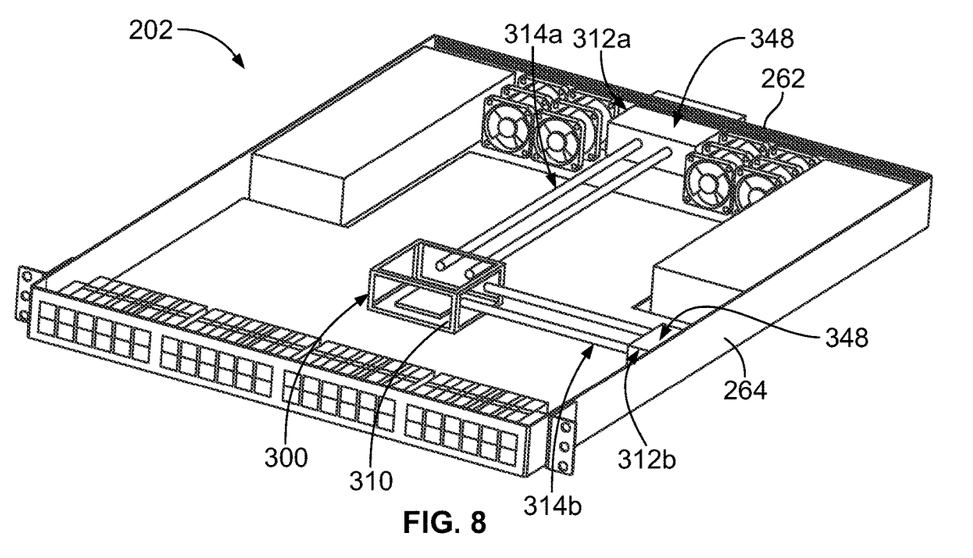
FIG. 8 is a top perspective view of the electrical device showing the heat exchange assembly in accordance with an exemplary embodiment.

FIG. 8 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, the first device heat exchanger 312a and the second device heat exchanger 312b. The first and second thermal conduits 314a, 314b extend between the component heat exchanger 310 and the device heat exchangers 312a, 312b. The first device heat exchanger 312a extends to an area proximate to the rear wall 262 and provides the separable thermal interface 348 at a top surface of the first device heat exchanger 312a. The second device heat exchanger 312b extends to an area proximate to the side wall 264 and provides the separable thermal interface 348 at a top surface of the second device heat exchanger 312b. The separable thermal interfaces 348 are configured to interface with the external heat exchanger 206 located above the electrical device 202 or with an adjacent electrical device 202 in the stack located above the electrical device 202. For example, the device heat exchangers 312 may dissipate heat between the electrical devices 202.

Figure 9:
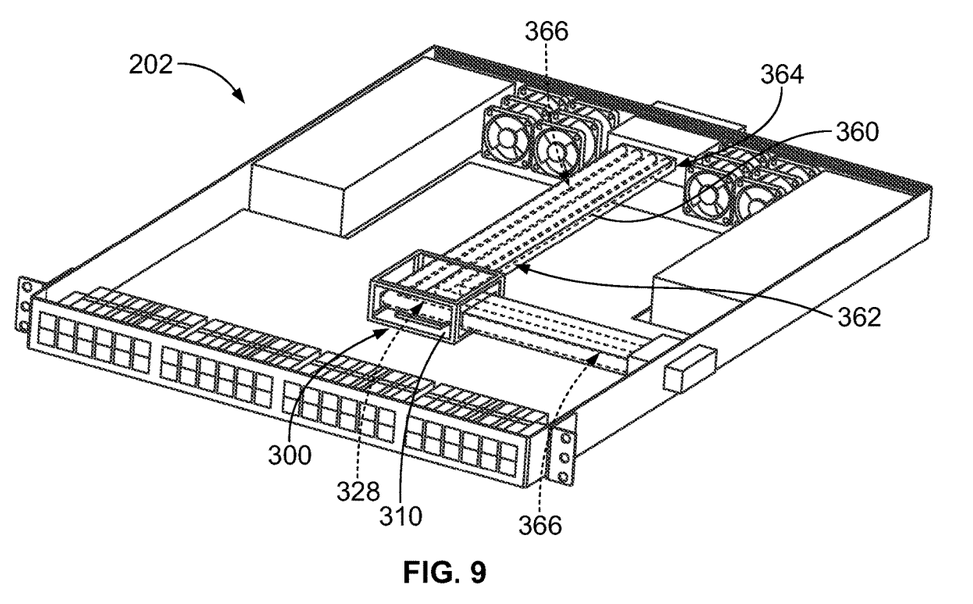
FIG. 9 is a top perspective view of the electrical device showing the heat exchange assembly in accordance with an exemplary embodiment.

FIG. 9 is a top perspective view of the electrical device 202 in accordance with an exemplary embodiment showing the heat exchange assembly 300 in accordance with an exemplary embodiment. In the illustrated embodiment, the electrical device 202 includes the component heat exchanger 310, the device heat exchangers 312a, 312b and thermal conduits 314a, 314b extending between the component heat exchanger 310 and the device heat exchangers 312a, 312b. The thermal conduits 314a, 314b include thermal blocks 360 each extending between a first end 362 and a second end 364 rather than the individual liquid pipes 320 (shown in FIG. 4). Each thermal block 360 includes conduits or passages 366 defining the liquid pipes for the liquid cooling circuit. The passages 366 may be in flow communication with passages 328 in the component heat exchanger 310 and/or passages (not shown) in the device heat exchangers 312a, 312b. In alternative embodiments, the thermal blocks 360 may be provided without the passages 366 for liquid cooling, rather using the material of the thermal block 360 to dissipate heat from the component heat exchanger 310 to the device heat exchangers 312a, 312b. The thermal blocks 360 are separate and discrete from the component heat exchanger 310 and the device heat exchangers 312a, 312b in various embodiments. Alternatively, the thermal blocks 360 may be integral with the component heat exchanger 310 and/or the device heat exchangers 312a, 312b.

Figure 10:
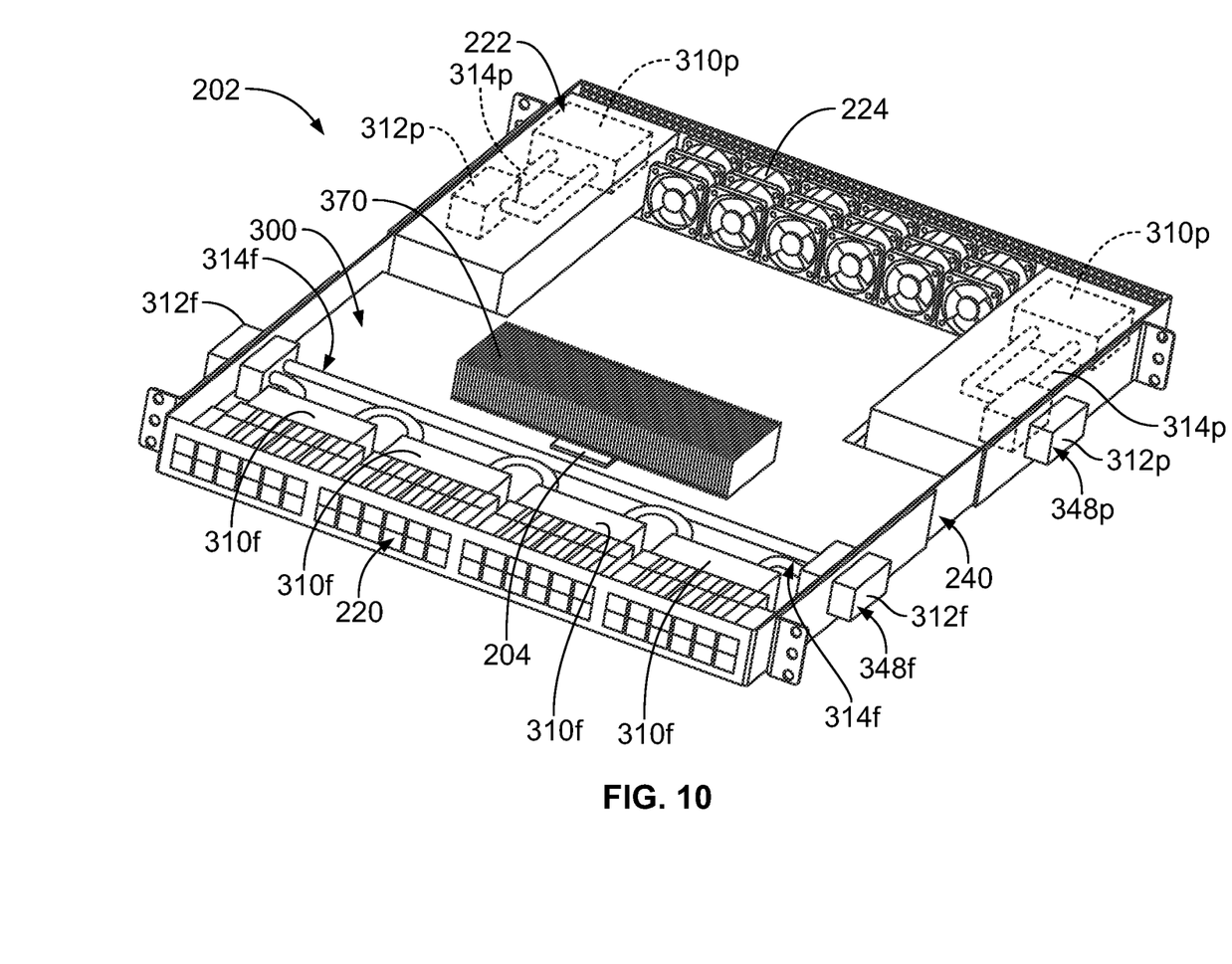
FIG. 10 is a top perspective view of the electrical device showing the heat exchange assembly in accordance with an exemplary embodiment.

FIG. 10 is a top perspective view of the electrical device 202 in accordance with an exemplary embodiment showing the heat exchange assembly 300 in accordance with an exemplary embodiment. In the illustrated embodiment, the electrical device 202 includes the electrical component 204, the I/O modules 220 and the power supplies 222. The heat exchange assembly 300 may be used to cool some or all of the component. In the illustrated embodiment, the heat exchange assembly 300 includes a heat sink 370 coupled to the electrical component 204. The heat sink 370 may be air cooled, such as with airflow provided by the fans 224.

The heat exchange assembly 300 includes component heat exchangers 310p coupled to heat generating electrical components of the power supplies 222. The heat exchange assembly 300 includes device heat exchangers 312p and thermal conduits 314p between the component heat exchangers 310p and the device heat exchangers 312p. The thermal conduits 314p form liquid loops for cooling the component heat exchangers 310p. The separable thermal interfaces 348p of the device heat exchangers 312p are provided at the exterior of the device housing 240 for interfacing with the external heat exchanger 206 (shown in FIG. 3).

The heat exchange assembly 300 includes component heat exchangers 310f coupled to heat generating electrical components of the I/O modules 220 at the front of the electrical device 202. The heat exchange assembly 300 includes device heat exchangers 312f and thermal conduits 314f coupled between the component heat exchangers 310f and the device heat exchangers 312f. The thermal conduits 314f form a liquid loop for cooling the component heat exchangers 310f In an exemplary embodiment, the component heat exchangers 310f are coupled to each other in series through corresponding thermal conduits 314f. The separable thermal interfaces 348f of the device heat exchangers 312f are provided at the exterior of the device housing 240 for interfacing with the external heat exchanger 206 (shown in FIG. 3).

Figure 11:
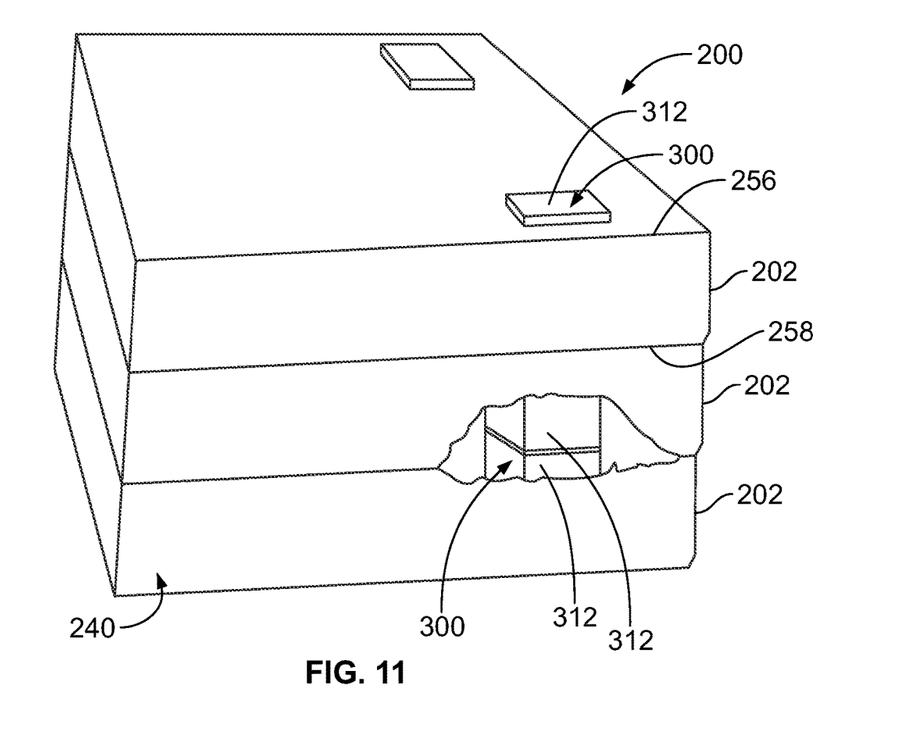
FIG. 11 is a perspective view of the system component illustrating the heat exchange assembly in accordance with an exemplary embodiment.

FIG. 11 is a perspective view of the system component 200 in accordance with an exemplary embodiment illustrating the heat exchange assembly 300 in accordance with an exemplary embodiment. The device heat exchangers 312 are provided at the exterior of the device housings 240. In an exemplary embodiment, the device heat exchangers 312 are provided at the top 256 and the bottom 258 of each device housing 240 for dissipating heat between the electrical devices 202 in the stack. A portion of the device housing 240 is removed to illustrate the device heat exchangers 312 interfacing each other within the stack. The device heat exchangers 312 are used to spread the cooling load between the electrical devices 202. For example, if the heat generating load of one of the electrical devices 202 (for example, the middle electrical device) is less than other electrical devices 202, such electrical device 202 (for example, the middle electrical device) may be used to help cool the other electrical devices 202 (for example, the upper and lower electrical devices).

Figure 12:
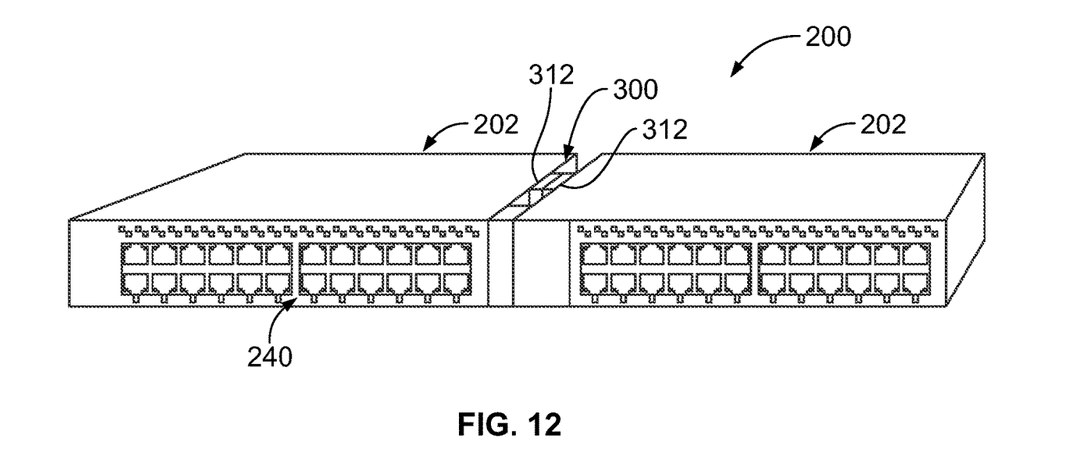
FIG. 12 is a perspective view of the system component illustrating the heat exchange assembly in accordance with an exemplary embodiment.

FIG. 12 is a perspective view of the system component 200 in accordance with an exemplary embodiment illustrating the heat exchange assembly 300 in accordance with an exemplary embodiment. In the illustrated embodiment, a pair of electrical devices 202 are arranged side-by-side. For example, the electrical devices 202 may be half-width electrical devices 202. The device heat exchangers 312 are provided at the exterior of the device housings 240. In an exemplary embodiment, the device heat exchangers 312 are provided at the sides, such as the inner sides of the device housings 240. The device heat exchangers 312 interface with each other between the electrical devices 202. The device heat exchangers 312 are used to spread the cooling load between the electrical devices 202.

Figure 13:
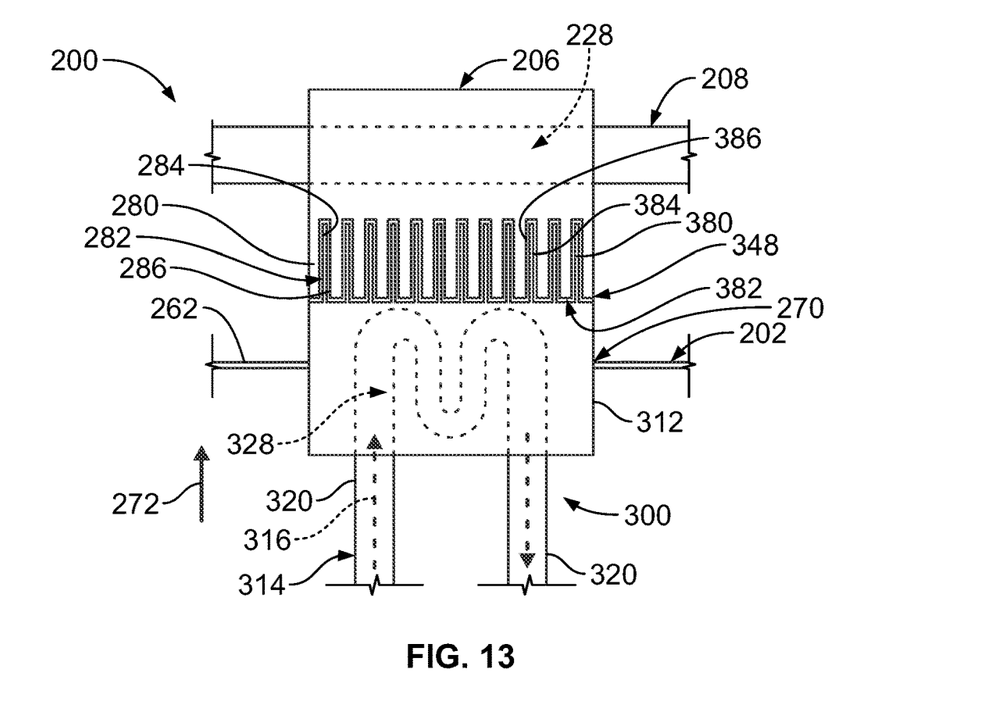
FIG. 13 is a top view of a portion of the system component showing the device heat exchanger thermally coupled to the external heat exchanger in accordance with an exemplary embodiment.

FIG. 13 is a top view of a portion of the system component 200 showing the device heat exchanger 312 thermally coupled to the external heat exchanger 206 in accordance with an exemplary embodiment. In the illustrated embodiment, the device heat exchanger 312 is a rear device heat exchanger 312 provided at the rear wall 262. The device heat exchanger 312 extends through the opening 270 in the rear wall 262 to interface with the external heat exchanger 206. The device heat exchanger 312 transfers heat to the external heat exchanger 206 across the separable thermal interface 348.

In an exemplary embodiment, the device heat exchanger 312 includes a passage 328 for liquid coolant flow. The passage 328 is in flow communication with the liquid pipes 320 of the thermal conduit 314 to transfer heat from the thermal conduit 314 to the device heat exchanger 312. The passage 328 may follow a tortuous, serpentine path through the device heat exchanger 312. The liquid cooling system 208 of the system component 200 is thermally coupled to the external heat exchanger 206. For example, the external heat exchanger 206 may include a passage 228 for liquid coolant flow from the liquid cooling system 208 through the external heat exchanger 206. The passage 228 is separate from the passage 328. The liquid coolant from the liquid cooling system 208 is not exchanged with the liquid coolant from the liquid loop 316 of the heat exchange assembly 300. The separable thermal interface 348 is a dry interface and liquid coolant does not pass across the separable thermal interface 348.

In an exemplary embodiment, the electrical device 202 is loaded into the equipment rack 210 (shown in FIG. 2) in a rearward loading direction 272. The device heat exchanger 312 is mated with the external heat exchanger 206 in the rearward loading direction 272. In an exemplary embodiment, the external heat exchanger 206 includes heat exchange fingers 280 separated by gaps 282. The device heat exchanger 312 includes heat exchange fingers 380 separated by gaps 382. The heat exchange fingers 380 are received in corresponding gaps 282 and the heat exchange fingers 280 are received in corresponding gaps 382. Sides 284, 286 of the heat exchange fingers 280 face sides 384, 386 of the heat exchange fingers 380 for efficient thermal exchange between the device heat exchanger 312 and the external heat exchanger 206.

Figure 14:
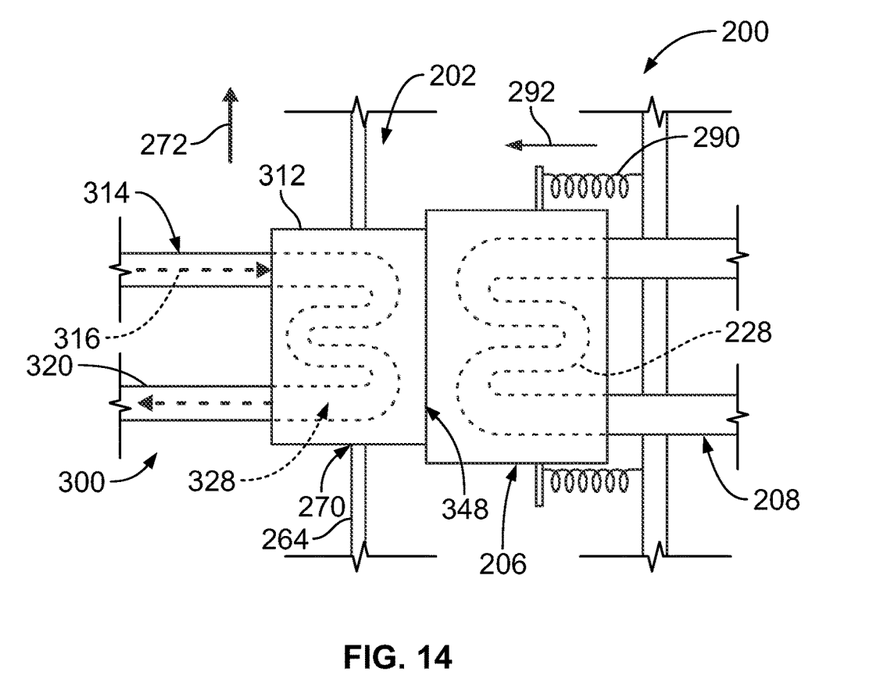
FIG. 14 is a top view of a portion of the system component showing the device heat exchanger thermally coupled to the external heat exchanger in accordance with an exemplary embodiment.

FIG. 14 is a top view of a portion of the system component 200 showing the device heat exchanger 312 thermally coupled to the external heat exchanger 206 in accordance with an exemplary embodiment. In the illustrated embodiment, the device heat exchanger 312 is a side device heat exchanger 312 provided at the side wall 264. The device heat exchanger 312 extends through the opening 270 in the side wall 264 to interface with the external heat exchanger 206. The device heat exchanger 312 transfers heat to the external heat exchanger 206 across the separable thermal interface 348.

In an exemplary embodiment, the device heat exchanger 312 includes the passage 328 for liquid coolant flow in flow communication with the liquid pipes 320 of the thermal conduit 314. The external heat exchanger 206 includes the passage 228 for liquid coolant flow from the liquid cooling system 208 through the external heat exchanger 206. The liquid coolant from the liquid cooling system 208 is not exchanged with the liquid coolant from the liquid loop 316 of the heat exchange assembly 300. The separable thermal interface 348 is a dry interface and liquid coolant does not pass across the separable thermal interface 348.

In an exemplary embodiment, the electrical device 202 is loaded into the equipment rack 210 (shown in FIG. 2) in the rearward loading direction 272. The device heat exchanger 312 mates with the external heat exchanger 206 in a sliding mating movement. In an exemplary embodiment, the external heat exchanger 206 includes biasing elements 290 coupled to the external heat exchanger 206 forcing the external heat exchanger 206 in a mating direction 292, which may be generally perpendicular to the loading direction 272. The biasing elements 290 may be springs in various embodiments. The external heat exchanger 206 is forced into direct engagement with the separable thermal interface 348 for efficient thermal exchange between the device heat exchanger 312 and the external heat exchanger 206. In alternative embodiments, the external heat exchanger 206 may be fixed and the device heat exchanger 312 may be movable in a mating direction, such as using biasing elements.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical device comprising:
a device housing having a frame defining a cavity, the device housing including a front, a rear, a first side between the front and the rear and a second side between the front and the rear, the rear of the device housing configured to be plugged into an equipment rack in a plugging direction;
an electrical component received in the cavity; and
a heat exchange assembly received in the cavity, the heat exchange assembly including a component heat exchanger having a component thermal interface thermally coupled to the electrical component, the heat exchange assembly including a device heat exchanger extending along the first side, the device heat exchanger having a separable thermal interface extending to an exterior of the frame of the device housing to interface with an external heat exchanger in a sliding mating direction parallel to the plugging direction, the separable thermal interface being a compressible interface with the external heat exchanger, the separable thermal interface being compressible in a direction perpendicular to the plugging direction, the separable thermal interface oriented parallel to the first side, the device heat exchanger transferring heat to the external heat exchanger across the separable thermal interface, the separable thermal interface being a dry interface with the external heat exchanger, the heat exchange assembly including a thermal conduit between the component heat exchanger and the device heat exchanger, the thermal conduit including a liquid pipe circulating heat between the component heat exchanger and the device heat exchanger, wherein the liquid pipe is spaced apart from the separable thermal interface such that the separable thermal interface is a dry interface with the external heat exchanger.

2. The electrical device of claim 1, wherein the liquid pipe forms a closed liquid loop through the heat exchange assembly between the component heat exchanger and the device heat exchanger.

3. The electrical device of claim 1, wherein the component heat exchanger is separate and discrete from the device heat exchanger, the thermal conduit extending between the component heat exchanger and the device heat exchanger.

4. The electrical device of claim 1, wherein the component heat exchanger includes a cold plate dissipating heat from the electrical component, the device heat exchanger including a cold plate defining the separable thermal interface, the thermal conduit extending between the cold plate of the component heat exchanger and the cold plate of the device heat exchanger.

5. The electrical device of claim 1, wherein the device heat exchanger is a first device heat exchanger, the heat exchange assembly further comprising a second device heat exchanger having a second separable thermal interface configured to extend to an exterior of the device housing to interface with a second external heat exchanger.

6. The electrical device of claim 5, further comprising a second thermal conduit extending between the component heat exchanger and the second device heat exchanger.

7. The electrical device of claim 5, wherein the second device heat exchanger extends along the second side, the second device heat exchanger interfacing with the second external heat exchanger in a sliding mating direction parallel to the plugging direction, the second separable thermal interface being a compressible interface with the second external heat exchanger, the second separable thermal interface oriented parallel to the second side, the second separable thermal interface being a dry interface with the second external heat exchanger.

8. The electrical device of claim 5, wherein the second device heat exchanger extends along the rear, the second device heat exchanger interfacing with the second external heat exchanger in the plugging direction, the second separable thermal interface being a compressible interface with the second external heat exchanger, the second separable thermal interface oriented parallel to the rear, the second separable thermal interface being a dry interface with the second external heat exchanger.

9. The electrical device of claim 1, wherein the device heat exchanger includes a plurality of plates separated by gaps at the separable thermal interface, the gaps configured to receive plates of the external heat exchanger such that the plates of the device heat exchanger face the plates of the external heat exchanger for thermal bridging therebetween.

10. The electrical device of claim 1, further comprising a heat exchange element having a lower surface defining the component heat exchanger and an end surface defining the device heat exchanger, a heat exchange body of the heat exchange element defining the thermal conduit between the component heat exchanger at the lower surface and the device heat exchanger at the end surface of the heat exchange element.

11. The electrical device of claim 1, wherein the external heat exchanger includes biasing elements coupled to the external heat exchanger forcing the external heat exchanger in a mating direction generally perpendicular to the plugging direction.

12. The electrical device of claim 1, wherein the device housing is mounted to the equipment rack when fully plugged into the equipment rack.

\* \* \* \* \*